United States Patent
Shiiki et al.

(10) Patent No.: US 6,844,599 B2
(45) Date of Patent: Jan. 18, 2005

(54) SEMICONDUCTOR DEVICE AND METHOD OF MANUFACTURING THE SAME

(75) Inventors: Mika Shiiki, Chiba (JP); Hiroaki Takasu, Chiba (JP)

(73) Assignee: Seiko Instruments Inc., Chiba (JP)

( * ) Notice: Subject to any disclaimer, the term of this patent is extended or adjusted under 35 U.S.C. 154(b) by 17 days.

(21) Appl. No.: 09/916,527

(22) Filed: Jul. 27, 2001

(65) Prior Publication Data
US 2002/0047183 A1 Apr. 25, 2002

(30) Foreign Application Priority Data
Aug. 30, 2000 (JP) .......................... 2000-260803

(51) Int. Cl.$^7$ .......................... H01L 29/76; H01L 29/00; H01L 29/04
(52) U.S. Cl. .......................... 257/379; 257/60; 257/538
(58) Field of Search .......................... 257/358, 60, 213

(56) References Cited

U.S. PATENT DOCUMENTS

| 5,296,726 A | * | 3/1994 | MacElwee | 257/213 |
| 5,708,284 A | * | 1/1998 | Onishi | 257/295 |
| 6,369,409 B1 | * | 4/2002 | Takasu et al. | 257/379 |
| 6,372,585 B1 | * | 4/2002 | Yu | 438/301 |

* cited by examiner

*Primary Examiner*—Amir Zarabian
*Assistant Examiner*—Kiesha Rose
(74) *Attorney, Agent, or Firm*—Adams & Wilks (57) ABSTRACT

A semiconductor device has thin film resistors connected in series to form a bleeder resistance circuit. Each of the thin film resistors is made of a polysilicon film doped with B or $BF_2$ P-type impurities and has two end portions each having a high impurity concentration region. A first insulating film overlies the thin film resistors. First conductors are connected to the ends of the thin film resistors for connecting the thin film resistors in series. The semiconductor device has second conductors each connected to a respective one of the first conductors and overlying a respective one of the thin film resistors through the first insulating film.

26 Claims, 12 Drawing Sheets

FILM THICKNESS OF POLY-SI RESISTOR

SEMICONDUCTOR DEVICE AND METHOD OF MANUFACTURING THE SAME

BACKGROUND OF THE INVENTION

1. Field of the Invention

The present invention relates to a semiconductor device, in particular, a bleeder resistance circuit using a thin film resistor, a semiconductor device having the bleeder resistance circuit, and a method of manufacturing the same.

2. Description of the Related Art

Conventionally, a bleeder resistance circuit using a thin film resistor is used in many cases. However, attention is not paid on a potential of a wiring located on the thin film resistor and a potential of a conductor located under the thin film resistor. Thus, the circuits with different arrangements are known. In addition, polysilicon is often used for a thin film resistor material. In the case where an MOS type transistor is combined on a single chip, it is known that the polysilicon with the same film thickness as a gate electrode of the MOS type transistor is used.

However, there is a problem in that a voltage dividing ratio often becomes inaccurate in the conventional bleeder resistance circuit using the thin film resistor. Also, in the case of the conventional bleeder resistance circuit in which the MOS type transistor is combined on a single chip, a change in a resistance value (temperature coefficient of the resistance value) by the temperature of a polysilicon thin film resistor is large in a region with a high sheet resistance value of 1 kiloohm/square or more. Thus, in order to obtain high voltage dividing precision over a wide temperature range, a low sheet resistance value must be set. Therefore, there is a problem in that an area occupied by the bleeder resistance circuit region in which a high resistance value of megaohm order or more is required is expanded as a whole.

SUMMARY OF THE INVENTION

The present invention has been made to solve the above problems, and an object of the present invention is therefore to provide a bleeder resistance circuit which has an accurate voltage dividing ratio, a small temperature coefficient of a resistance value, and high precision, and a semiconductor device using such a bleeder resistance circuit, which has high precision and a small temperature coefficient, such as a voltage detector or a voltage regulator.

To achieve the above object, first means used in a semiconductor device of the present invention is characterized in that, in a bleeder resistance circuit using a thin film resistor, the potential of a wiring located over the thin film resistor and the potential of a conductor located under the thin film resistor are made to be substantially the same as that of the thin film resistor. This arises from the fact that became evident that the resistance value of the thin film resistor is changed by the potentials of the wiring located thereover and the conductor located thereunder in the bleeder resistance circuit using the thin film resistor (in particular, a polysilicon thin film resistor) according to experiments of the present inventor(s).

To achieve the above object, second means used in a semiconductor device of the present invention is characterized in that, the film thickness of the polysilicon thin film resistor in the bleeder resistance circuit is made to be thinner than that of a gate electrode of an MOS type transistor combined on a single chip. This arises from the fact that became evident that, as the film thickness of the thin film resistor (in particular, a polysilicon thin film resistor) is thinner, the variation in the resistance value becomes smaller, and the temperature dependency of the resistance value becomes smaller even in the case of the same sheet resistance according to experiments of the present inventor(s).

To achieve the above object, third means used in a semiconductor device of the present invention is characterized in that an impurity introduced into the polysilicon thin film resistor in the bleeder resistance circuit is made to be a P-type. This arises from the fact that became evident that, if the impurity introduced into the thin film resistor is of the P-type, the variation in the resistance value becomes smaller, and the temperature dependency of the resistance value becomes smaller even in the case of the same sheet resistance according to experiments of the present inventor(s).

According to the semiconductor device of the present invention, in the bleeder resistance circuit using the thin film resistor, the potential of the wiring located over the thin film resistor and the potential of the conductor located under the thin film resistor are made to be substantially the same as that of the thin film resistor. Thus, the bleeder resistance circuit having an accurate voltage dividing ratio and high precision can be realized. In particular, when polysilicon is used for the thin film resistor, according to the present invention, the film thickness of the polysilicon thin film resistor in the bleeder resistance circuit is made to be thin, and further the variation in the resistance value can be suppressed by introducing the P-type impurity into the polysilicon. Further, the temperature dependency of the resistance value can be reduced.

Therefore, a semiconductor device using such a bleeder resistance circuit, having high precision and a small temperature coefficient, such as a voltage detector or a voltage regulator can be obtained.

DETAILED DESCRIPTION OF THE PREFERRED EMBODIMENTS

Figure 1:
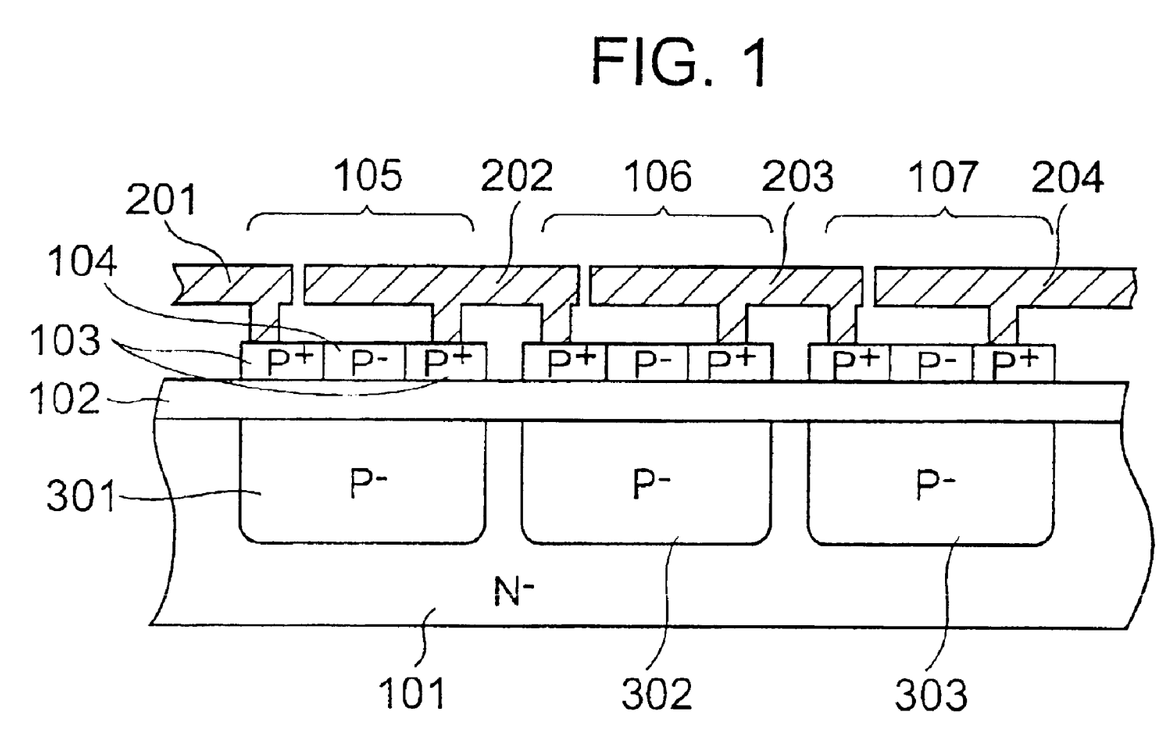
FIG. 1 is a schematic cross sectional view representing one embodiment of a bleeder resistance circuit region in a semiconductor device of the present invention.

A preferred embodiment of the present invention will be described with reference to the accompanying drawings. FIG. 1 is a schematic cross sectional view representing one embodiment of a bleeder resistance circuit region in a semiconductor device of the present invention.

Separated P-type well regions 301, 302, and 303 are formed in a silicon semiconductor substrate 101 having a lightly N-type impurity concentration. It is preferred that an impurity concentration of the well regions 301, 302, and 303 is about 1E16 atoms/cm$^3$ or more in the surface of the silicon semiconductor substrate 101 from the viewpoint of preventing the depletion of the silicon semiconductor substrate 101. Thus, the well regions may be provided with a heavy impurity concentration. A silicon oxide film 102 is formed on the silicon semiconductor substrate 101. Polysilicon resistors 105, 106, and 107 each having a high resistance region 104 sandwiched between heavy P-type impurity regions 103 for making contact with wirings are formed on the silicon oxide film 102. Further, wirings 201, 202, 203, and 204 made of aluminum are connected with the heavy P-type impurity regions 103.

Here, although not shown in the figure, the well regions 301, 302, and 303 are electrically connected with the wirings 202, 203, and 204, respectively, and thus these are made to have the same potential. Therefore, a potential of the high resistance region 104 of the polysilicon resistor 105, a potential of the wiring 202 located over the polysilicon resistor 105, and a potential of the well region 301 located under the polysilicon resistor 105 are substantially equal to each other. A potential relationship among the polysilicon resistor 106, the wiring 203 located over the polysilicon resistor 106, and the well region 302 located under the polysilicon resistor 106 is the same as in the case of the polysilicon resistor 105. Also, a potential relationship among the polysilicon resistor 107, the wiring 204 located over the polysilicon resistor 107, and the well region 303 located under the polysilicon resistor 107 is the same as in the case of the polysilicon resistor 105.

As described above, when the potential of the respective polysilicon resistors is equal to those of the wirings and the well regions, which are located over and under the respective polysilicon resistors, resistance values of the polysilicon resistors 105, 106, and 107 are accurately kept. Note that, in the case where the silicon oxide film 102 is formed thin, instead of this film, a composite film comprising a silicon nitride film is used. Thus, a high insulation can be kept between the silicon semiconductor substrate 101 and the polysilicon resistors 105, 106, and 107. A conductivity type of the silicon semiconductor substrate 101 may be a P-type. In this case, the well regions 301, 302, and 303 are set to be an N-type. The number of polysilicon resistors is not limited, and may be set in accordance with voltage dividing numbers required in the bleeder resistance circuit. Although not shown in the figure, in order to take first priority over a high integration of the bleeder resistance circuit, when it is difficult to divide and locate the well regions for respective resistors, the well regions 301, 302, and 303 may be combined for several resistors or formed as a single unit without dividing. In this case, voltage dividing precision is reduced somewhat, but this is next best following the embodiment of FIG. 1. In FIG. 1, the case where the silicon semiconductor substrate 101 is formed as the N-type and the well regions 301, 302, and 303 are formed as the P-type is described. However, the silicon semiconductor substrate 101 may be formed as the P-type and the well regions 301, 302, and 303 may be formed as the N-type. Further, in FIG. 1, it is described that the wirings are made of aluminum. However, the wirings may be made from a lamination film of a barrier metal and a silicide film. Here, the barrier metal refers to a protective film that is formed under a wiring and has a high corrosion resistance and a high environmental resistance, for ensuring reliability maintenance and a long life of a semiconductor device. In the present invention, a lamination film of TiN and Ti is used as the barrier metal and Al—Si—Cu is used as the silicide film. Note that Al—Si may be used as the silicide film.

Figure 2:
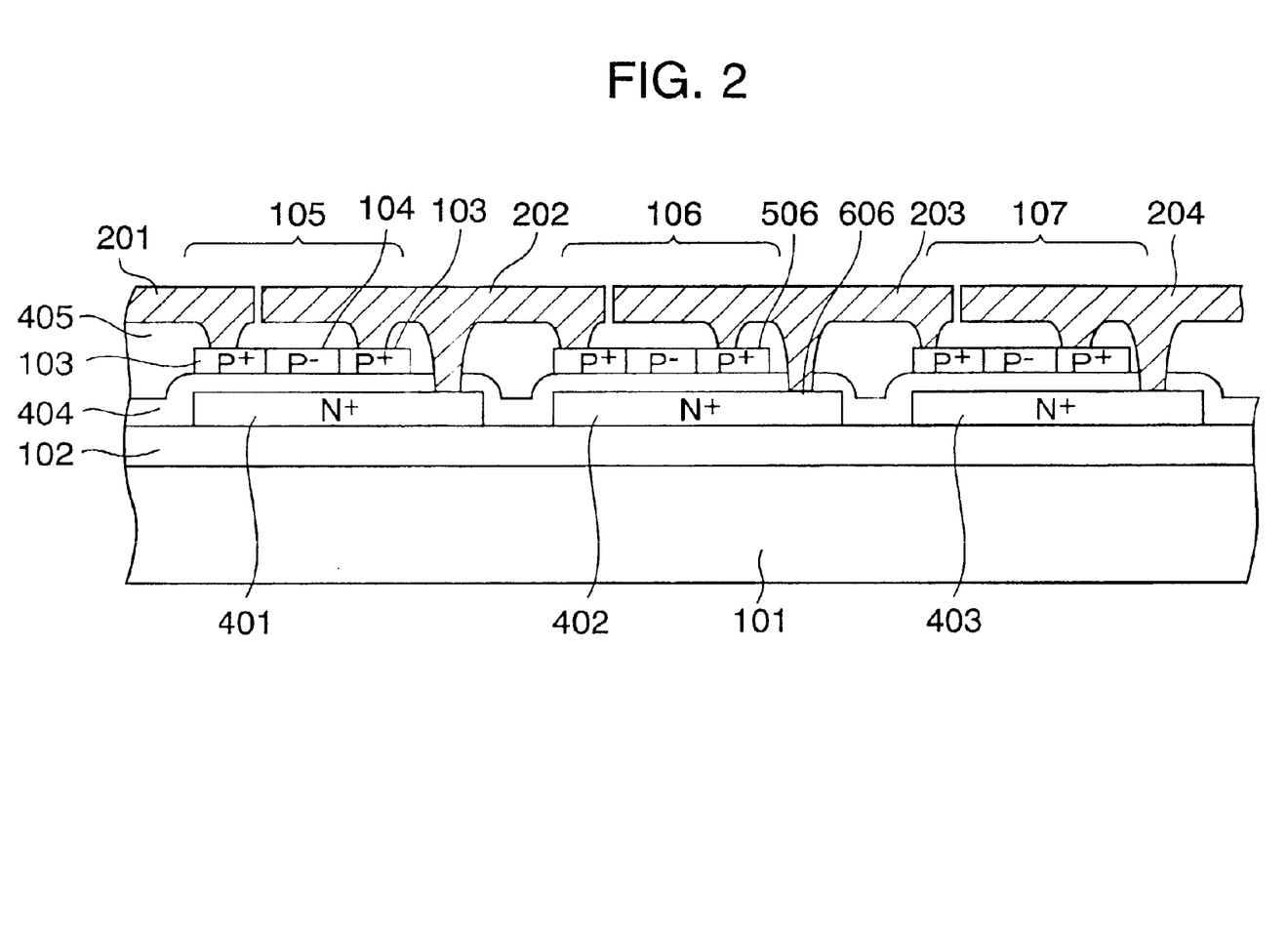
FIG. 2 is a schematic cross sectional view representing other embodiment of a bleeder resistance circuit region in a semiconductor device of the present invention.

FIG. 2 is a schematic cross sectional view representing other embodiment of a bleeder resistance circuit region in a semiconductor device of the present invention. A silicon oxide film 102 is formed on a silicon semiconductor substrate 101. Heavy N-type polysilicon thin films 401, 402, and 403 are formed on the silicon oxide film 102. Polysilicon resistors 105, 106, and 107 each having a high resistance region 104 sandwiched between heavy P-type impurity regions 103 for making contact with wirings are formed on the heavy N-type polysilicon thin films 401, 402, and 403 through a first insulating film 404 made of a silicon oxide film or the like. Also, aluminum wirings 201, 202, and 203 are formed on the polysilicon resistors 105, 106, and 107 through a second insulating film 405 made of a silicon oxide film or the like, and are connected with the heavy P-type impurity regions 103 of the polysilicon resistors 105, 106, and 107 and the heavy N-type polysilicon thin films 401, 402, and 403 through contact holes 506 and 606. Thus, a potential of the high resistance region 104 of the polysilicon resistor 105, a potential of the wiring 202 located over the polysilicon resistor 105, and a potential of the heavy N-type polysilicon thin film 401 located under the polysilicon resistor 105 are substantially equal to each other. A potential relationship among the polysilicon resistor 106, the wiring 203 located over the polysilicon resistor 106, and the heavy N-type polysilicon thin film 402 located under the polysilicon resistor 106 is the same as in the case of the polysilicon resistor 105. Also, a potential relationship among the polysilicon resistor 107, the wiring 204 located over the polysilicon resistor 107, and the heavy N-type polysilicon thin film 403 located under the polysilicon resistor 107 is the same as in the case of the polysilicon resistor 105.

As described above, when the potential of the respective polysilicon resistors is equal to those of the wirings and the heavy N-type polysilicon thin films, which are located over and under the respective polysilicon resistors, resistance values of the polysilicon resistors 105, 106, and 107 are accurately kept. Note that, although not shown in the figure, in the case where a MOS type transistor is formed together with the bleeder resistance circuit on a single chip, when a gate electrode is formed using the same film as for the heavy N-type polysilicon thin films 401, 402, and 403, a manufacturing process is simplified. Further, as described in the embodiment of FIG. 1, from the viewpoint of reliability, it is effective that a composite film comprising a silicon nitride film is formed as both or one of the first insulating film 404 and the second insulating film 405. The number of polysilicon resistors is not limited, and may be set in accordance with voltage dividing numbers required in the bleeder resistance circuit. In FIG. 2, it is described that the wirings are made of aluminum. However, the wirings may be made from a lamination film of a barrier metal and a silicide film. In the present invention, a lamination film of TiN and Ti is used as the barrier metal and Al—Si—Cu is used as the silicide film. However, Al—Si may be used as the silicide film.

Figure 3:
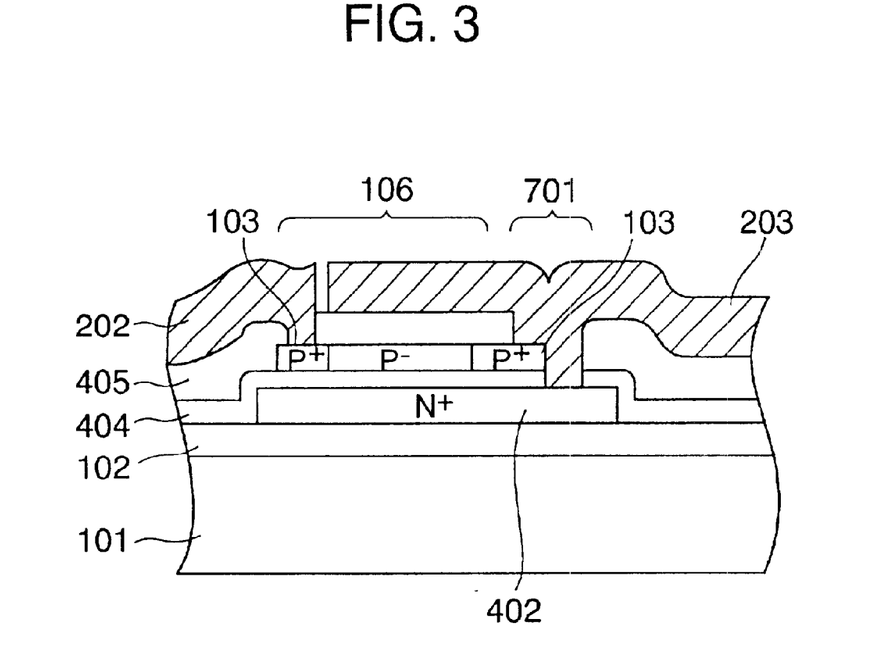
FIG. 3 is a schematic cross sectional view representing one embodiment in which a portion of a bleeder resistance circuit region in a semiconductor device of the present invention is enlarged.

FIG. 3 is a schematic cross sectional view representing one embodiment in which a portion of a bleeder resistance circuit region in a semiconductor device of the present invention is enlarged.

The following point is different from the embodiment shown in FIG. 2. That is, the connection between an aluminum wiring 203 and a heavy P-type impurity region 103 of a polysilicon resistor 106, and the connection between the aluminum wiring 203 and a heavy N-type polysilicon thin film 402 of the polysilicon resistor 106, which are desired to be the same potential, are made through one contact hole 701. By this, an area occupied by a contact hole forming region can be reduced, and thus there is an effect for the reduction in the area of the entire bleeder resistance circuit region. Other portions are provided with the same reference numerals as those of FIG. 2, and thus the explanation is omitted.

Figure 4:
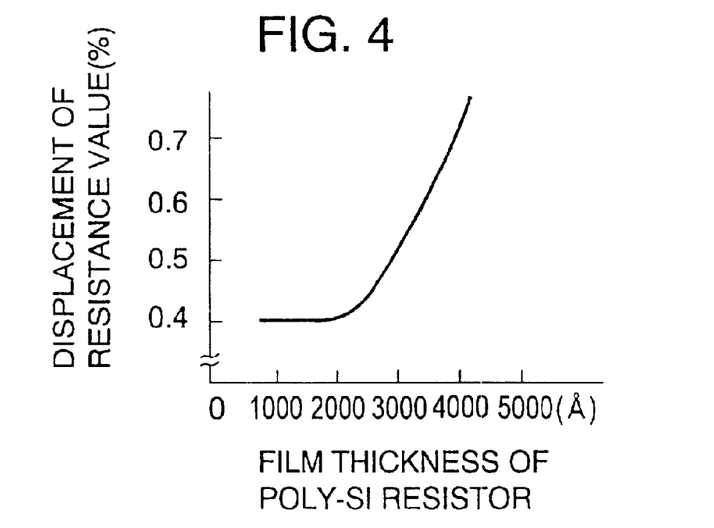
FIG. 4 shows a relationship between a displacement in a resistance value of a polysilicon resistor and the film thickness of the polysilicon resistor in the case where a potential of 0 volt to 5 volts is applied to an aluminum wiring located over the polysilicon resistor having a sheet resistance of 10 kiloohms.

FIG. 4 shows a relationship between a displacement (variation) in a resistance value of the polysilicon resistor and the film thickness of the polysilicon resistor in the case where a potential of 0 volt to 5 volts is applied to the aluminum wiring located over the polysilicon resistor having a sheet resistance of 10 kiloohms.

As apparent from FIG. 4, as the film thickness of the polysilicon resistor is thinner, the resistance value is hardly influenced by the potential of the wiring. In particular, when the film thickness of the polysilicon resistor is set to be several tens to 2000 angstroms, the variation in the resistance value can be suppressed within a small range. At this time, in order to form the polysilicon resistor with uniform continuous films, it is desirable that the film thickness is set to be 100 angstroms or thicker in the case of a current manufacturing method (such as a CVD method). If discontinuous films are formed, the variation in the resistance value occurs all the more.

In the semiconductor device of the present invention, the bleeder resistance circuit having a small occupation area, a small dividing voltage output error, and high precision can be realized using the polysilicon thin film resistor into which the P-type impurity is introduced. Hereinafter, a preferred embodiment of the present invention will be described with reference to the accompanying drawings.

Figure 5:
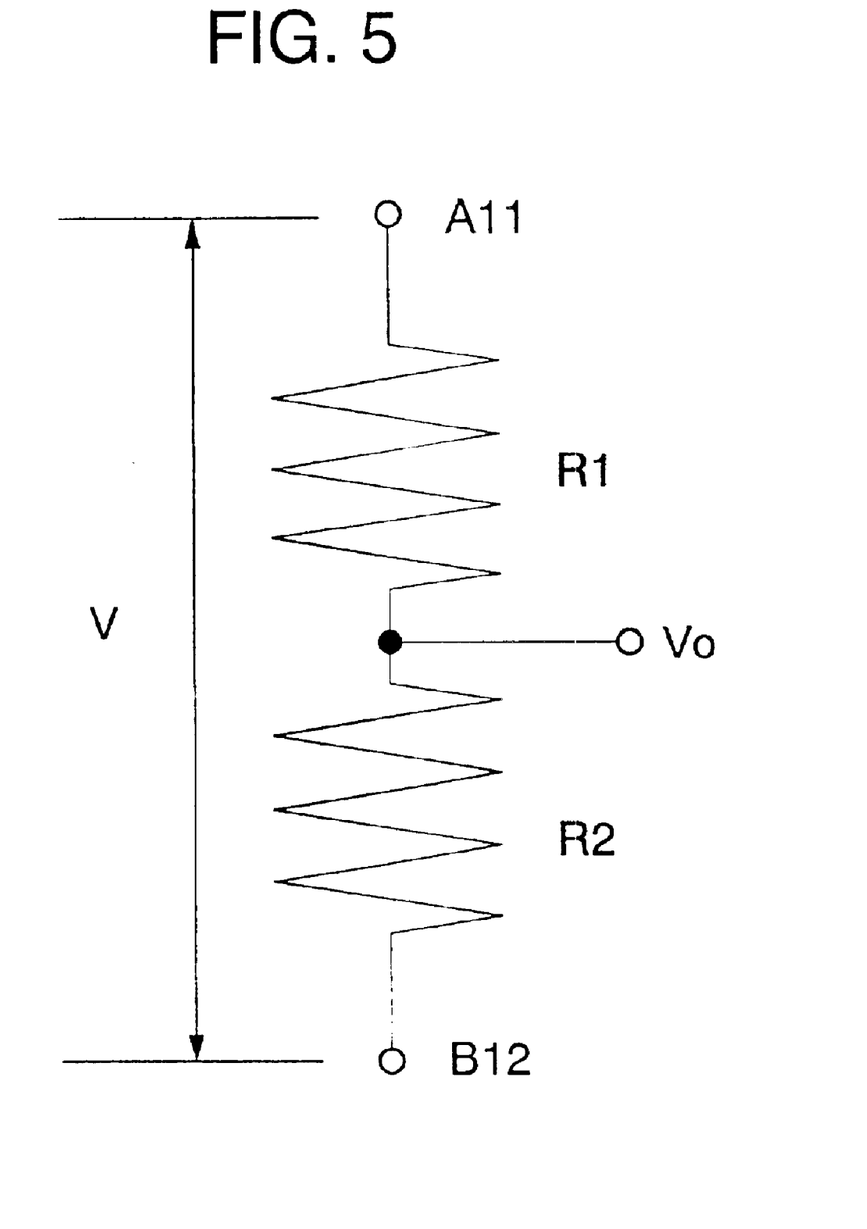
FIG. 5 is a circuit diagram of a bleeder resistance circuit representing one embodiment of a semiconductor device of the present invention.

FIG. 5 is a circuit diagram of a bleeder resistance circuit representing one embodiment of a semiconductor device of the present invention.

A voltage V applied between a terminal A11 and a terminal B12 is divided by respective resistors R1 and R2, and thus a dividing voltage Vo is obtained from a terminal C13. This dividing voltage Vo is represented by the following equation:

$$Vo=(R2/(R1+R2))\times V \quad (1)$$

Assume that the dividing voltage Vo by the equation (1) is a theoretical value, and a difference between this theoretical value and a measurement value is a dividing voltage output error. The dividing voltage output error is represented by the following equation:

$$\text{Dividing voltage output error}=((|\text{theoretical value }Vo-\text{measurement value }Vo|)/\text{theoretical value }Vo)\times 100 \quad (2)$$

Here, it will be described based on data that the dividing voltage output error can be reduced by changing the impurity introduced into the polysilicon thin film resistor from the N-type to the P-type.

A characteristic required for the polysilicon thin film resistor constituting a rudder circuit includes that the dividing voltage output error of the bleeder circuit and an integrated area are small. Generally, if the film thickness of polysilicon is thinned, a variation in the concentration of a low concentration impurity is reduced. Thus, the dividing voltage output error of the bleeder circuit becomes small, and the bleeder circuit with high precision can be manufactured. However, even if the film thickness of polysilicon is thinned, when the length of the polysilicon thin film resistor into which an N-type impurity is introduced (hereinafter referred to as an N-type polysilicon thin film resistor) is made short, since the dividing voltage output error becomes large, it is difficult to reduce the integration area. However, when a P-type polysilicon thin film resistor is used, the length of this resistor can be shortened and the integration area can be reduced. An example will be described with reference to FIG. 3.

Figure 6:
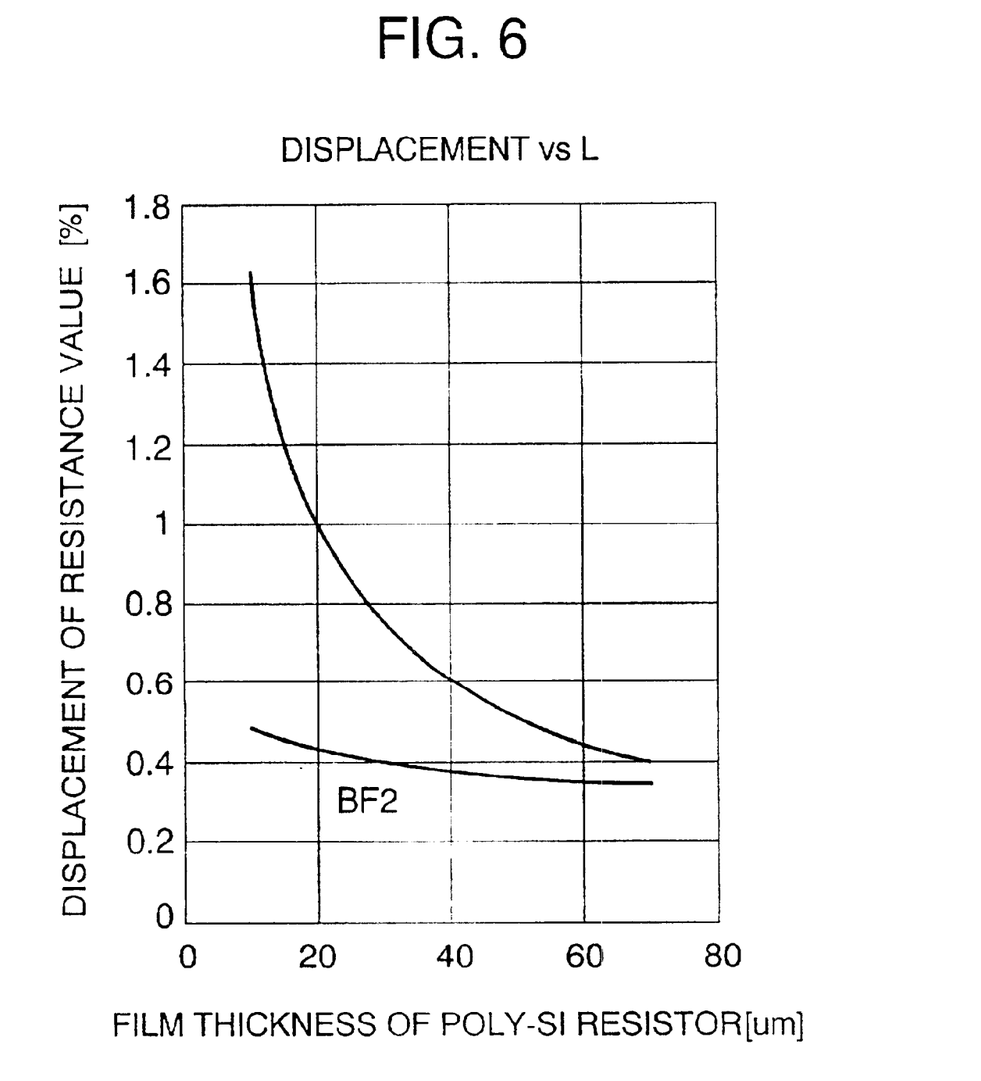
FIG. 6 shows a relationship between the lengths of P-type and N-type polysilicon thin film resistors which have a film thickness of 1000 angstroms and a sheet resistance of 10 kiloohms/square and constitute the bleeder circuit and the dividing voltage output error.

FIG. 6 shows a relationship between the lengths of the P-type and N-type polysilicon thin film resistors which have a film thickness of 1000 angstroms and a sheet resistance of 10 kiloohms/square and constitute the bleeder circuit and the dividing voltage output error. Here, the example is shown, in which $BF_2$ is used as the P-type impurity introduced into the P-type polysilicon thin film resistor and phosphorus is used as the N-type impurity introduced into the N-type polysilicon thin film resistor.

From FIG. 6, even if the film thickness of the polysilicon in the bleeder circuit composed of the N-type polysilicon thin film resistor is thinned to be 1000 angstroms, when the length of the polysilicon thin film resistor is 30 μm or shorter, the dividing voltage output error of 0.5% or less cannot be obtained. However, in the case of the bleeder circuit composed of the P-type polysilicon thin film resistor, even if the length of the polysilicon thin film resistor is 10 μm, the dividing voltage output error of 0.5% or less can be obtained.

Figure 7:
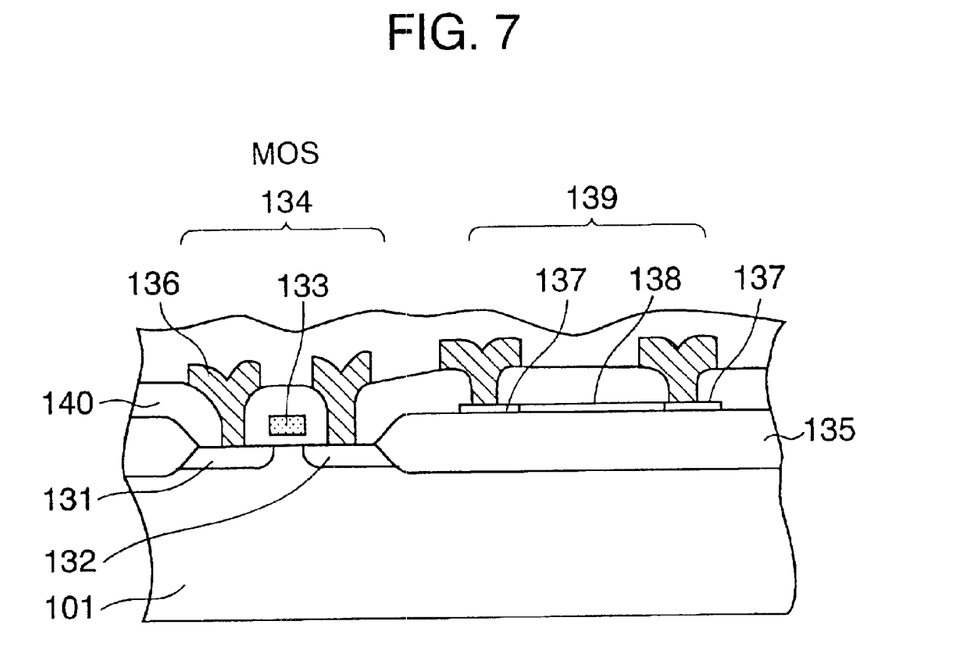
FIG. 7 is a schematic cross sectional view representing other embodiment of a semiconductor device of the present invention.

FIG. 7 is a schematic cross sectional view representing other embodiment of a semiconductor device of the present invention.

An MOS type transistor 134 which has a pair of regions (source region 131 and drain region 132) and a polysilicon gate electrode 133 is formed on a silicon semiconductor substrate 101. On the other hand, a polysilicon thin film resistor 139 which has a high resistance region 138 sandwiched between high concentration impurity regions 137 for making contact with aluminum wirings 136 is formed on a field oxide film 135. In FIG. 7, only one polysilicon thin film resistor is shown for simplification. However, an actual bleeder resistance circuit region is formed by a large number of polysilicon thin film resistors.

In FIG. 7, the film thickness of the polysilicon gate electrode 133 of the MOS type transistor 134 is different from that of the polysilicon thin film resistor 139 into which the P-type impurity is introduced, and the polysilicon thin film resistor 139 is formed thinner. For example, the film thickness of the polysilicon gate electrode 133 is set to be 4000 angstroms, and the film thickness of the polysilicon thin film resistor 139 is set to be 1000 angstroms. The polysilicon gate electrode 133 is required such that a portion thereof acts as a wiring, and thus it is desirable that a sheet resistance value is as low as possible. In contrast to this, the polysilicon thin film resistor 139 is required such that a sheet resistance value is as high and accurate as possible and a temperature coefficient of a resistance value is as small as possible. Thus, it is natural and effective that the film thicknesses of the polysilicon gate electrode 133 of the MOS type transistor 134 and the polysilicon thin film resistor 139 are changed in accordance with objects. Here, as a method of reducing the temperature coefficient of the resistance value of the polysilicon thin film resistor 139, a method of thinning the film thickness of the polysilicon thin film resistor 139 and introducing the P-type impurity into the polysilicon thin film resistor 139 is simple and easy and has a large effect. Hereinafter, the explanation will be made based on experimental data of the present inventor(s).

Figure 8:
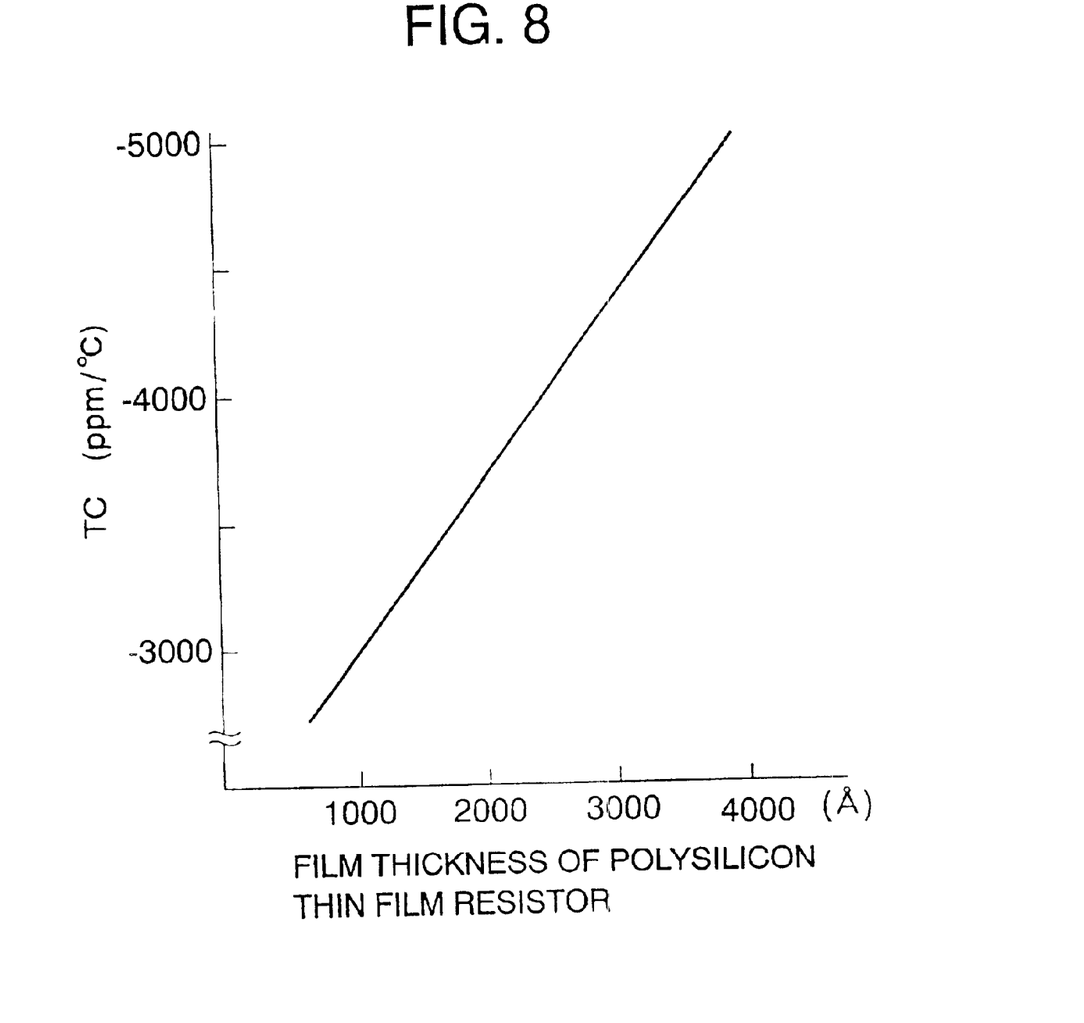
FIG. 8 shows a relationship between the temperature coefficient (TC) of the resistance value of the polysilicon thin film resistor for the bleeder resistance circuit with the sheet resistance of 10 kiloohms and the film thickness of the polysilicon thin film resistor.

FIG. 8 shows a relationship between the temperature coefficient (TC) of the resistance value of the polysilicon thin film resistor for the bleeder resistance circuit with the sheet resistance of 10 kiloohms and the film thickness of the polysilicon thin film resistor.

From FIG. 8, it is apparent that the temperature coefficient (TC) of the resistance value of the polysilicon thin film resistor can be markedly reduced by thinning the film thickness of the polysilicon thin film resistor. In particular, when the film thickness is 1000 angstroms or thinner, the TC can be made extremely small to be −3000 ppm/° C. or less.

FIG. 8 is the example with respect to the polysilicon thin film resistor with the sheet resistance of 10 kiloohms. However, according to experiments of the present inventor (s), it becomes clear that the temperature coefficient (TC) of the resistance value of the polysilicon thin film resistor can be reduced in at least a sheet resistance range of 1 to 500 kiloohms by thinning the film thickness of the polysilicon thin film resistor.

Figure 9:
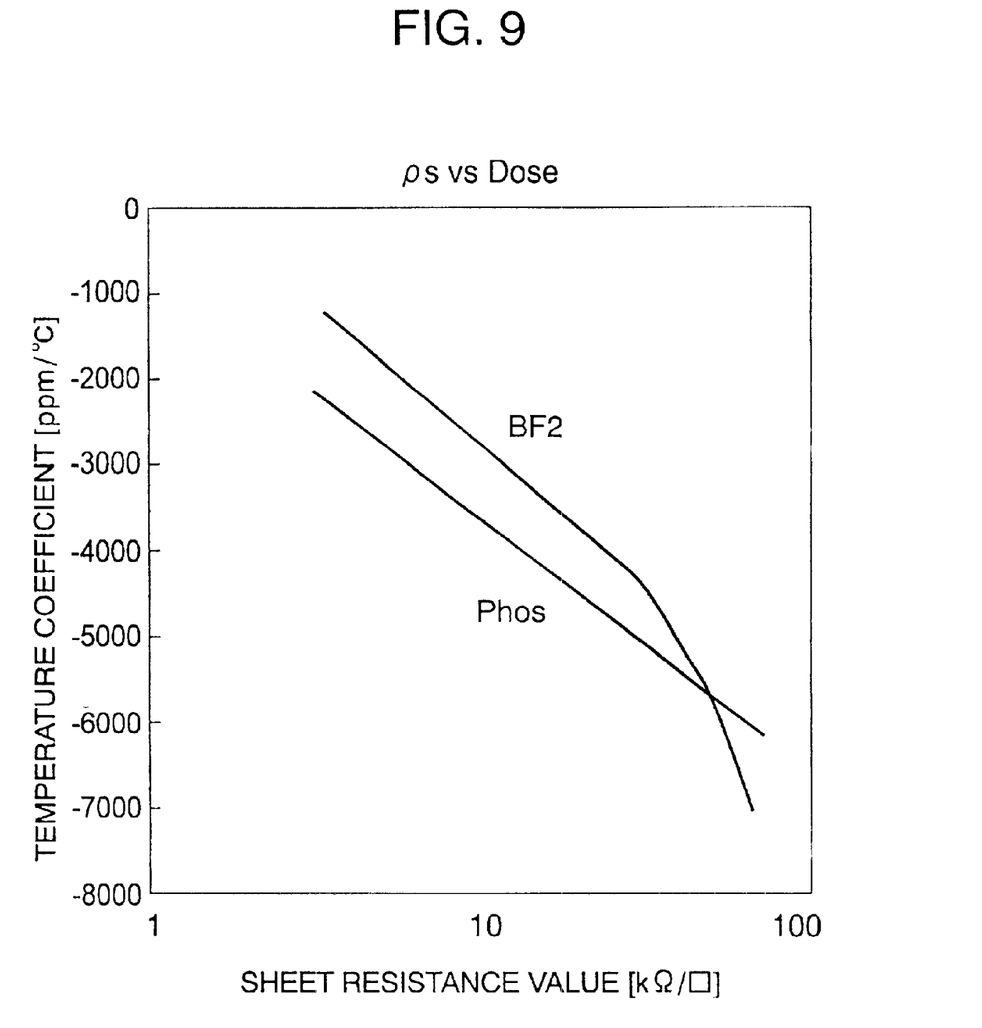
FIG. 9 shows a relationship between the sheet resistance value and the temperature coefficient (TC) in the case where $BF_2$ is used as a P-type impurity and phosphorus is used as an N-type impurity with respect to the polysilicon film having a film thickness of 1000 angstroms.

FIG. 9 shows a relationship between the sheet resistance value and the temperature coefficient (TC) in the case where $BF_2$ is used as the P-type impurity and phosphorus is used as the N-type impurity with respect to the polysilicon film having a film thickness of 1000 angstroms. It is shown that a variation in the resistance value against the temperature in the P-type polysilicon thin film resistor is smaller than that in the N-type polysilicon thin film resistor.

If the sheet resistance value is increased, a variation in the concentration of a low concentration impurity becomes larger, and thus the dividing voltage output error becomes larger. Further, the variation in the resistance value against the temperature becomes larger. Thus, it is desirable that the sheet resistance value is 25 kiloohms/square or less. On the other hand, if the sheet resistance value is small, a variation in a grain size cannot be neglected. Thus, it is desirable that the sheet resistance value is 1 kiloohm/square or more. That is, it is desirable that the sheet resistance value of the P-type polysilicon thin film resistor is 1 kiloohm/square to 25 kiloohms/square. At this time, the variation in the resistance value against the temperature of the P-type polysilicon thin film resistor is −4000 ppm/° C. or less.

Figure 10:
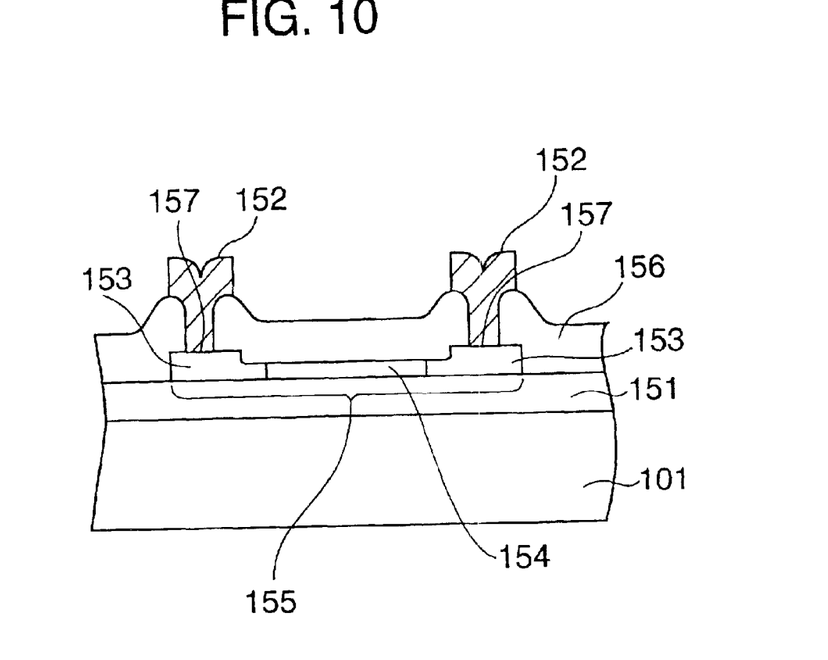
FIG. 10 is a schematic cross sectional view representing other embodiment of a semiconductor device of the present invention.

FIG. 10 is a schematic cross sectional view representing other embodiment of a semiconductor device of the present invention.

A first insulating film 151 made of silicon dioxide or the like is formed on a silicon semiconductor substrate 101. A polysilicon thin film resistor 155 having a high resistance region 154 sandwiched between low resistance regions 153 with high impurity concentrations for making contact with metal wirings 152 made of aluminum or the like is formed on the flat surface of the first insulating film 151. A second insulating film 156 made of PSG, BPSG, or the like is formed on the polysilicon thin film resistor 155 into which the P-type impurity is introduced and the first insulating film 151. Contact holes 157 are provided in the second insulating film 156 to electrically connect the metal wirings 152 with the low resistance regions 153 with high impurity concentrations. Here, the film thickness of the high resistance region 154 in the polysilicon thin film resistor 155 is made to be thinner than that of the low resistance regions 153. By thinning the film thickness of the high resistance region 154, a high sheet resistance value is obtained. Thus, while an occupation area is reduced, a small temperature coefficient is kept. On the other hand, when the contact holes 157 for connecting the metal wirings 152 with the low resistance regions 153 are formed, the low resistance regions 153 are formed thick such that the penetration of the polysilicon film does not occur. According to experiments of the present inventor(s), in the case where the sheet resistance value is about 10 kiloohms/square, when the film thickness of the high resistance region 154 is 1000 angstroms or thinner, it becomes clear that the temperature coefficient of the resistance value can be made extremely small to be −3000 ppm/° C. or less. Also, in a recent IC process, contact holes are generally formed by dry etching for minuteness. When the contact holes 157 are formed in the second insulating film 156, over etching is performed so as not to leave the etching residue. During this etching, the low resistance regions 153 in the polysilicon thin film resistor 155 are also etched. Thus, the penetration of the contact holes 157 is prevented by increasing the film thickness of the low resistance regions 153. In the case where the second insulating film 156 is made of PSG or BPSG and its film thickness is 1 $\mu$m or thinner, when the film thickness of the low resistance regions 153 is about 2000 angstroms or thicker, the penetration can be prevented.

Figure 11:
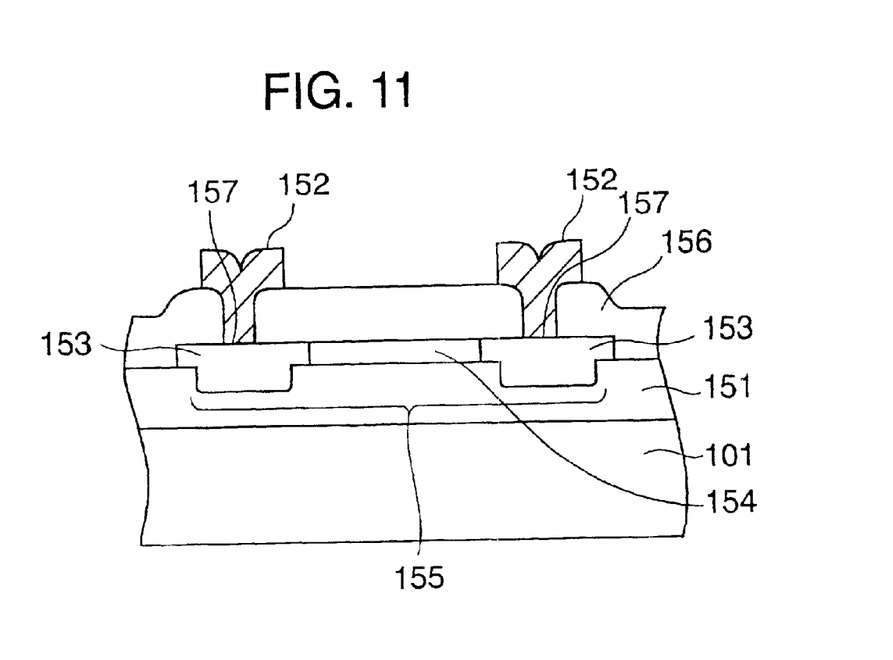
FIG. 11 is a schematic cross sectional view representing other embodiment of a semiconductor device of the present invention.

FIG. 11 is a schematic cross sectional view representing other embodiment of a semiconductor device of the present invention.

The following point is different from the embodiment shown in FIG. 9. That is, the film thickness of a first insulating film 151 is partially different. Low resistance regions 153 of a polysilicon thin film resistor 155 are formed on a region of the first insulating film 151, in which the film thickness is thin. Further, a high resistance region 154 is formed on a region of the first insulating film 151, in which the film thickness is thick. The upper surfaces of the low resistance regions 153 and the high resistance region 154 are formed to be substantially the same flat surface. By this, the film thickness of the high resistance region 154 can be formed thin and that of the low resistance regions 153 can be formed thick. Thus, an effect described in the embodiment of FIG. 10 is obtained. Other portions are provided with the same reference numerals as those of FIG. 10, and thus the explanation is omitted.

In FIGS. 10 and 11, only one polysilicon thin film resistor is shown for simplification. However, an actual resistance circuit region is formed by a large number of polysilicon thin film resistors. Also, in FIGS. 10 and 11, it is described that the wirings are made of aluminum. However, the wirings may be made from a lamination film of a barrier metal and a silicide film. In the present invention, for example, TiN and Ti are used as the barrier metal and Al—Si—Cu is used as the silicide film. However, Al—Si may be used as the silicide film.

Figure 12:
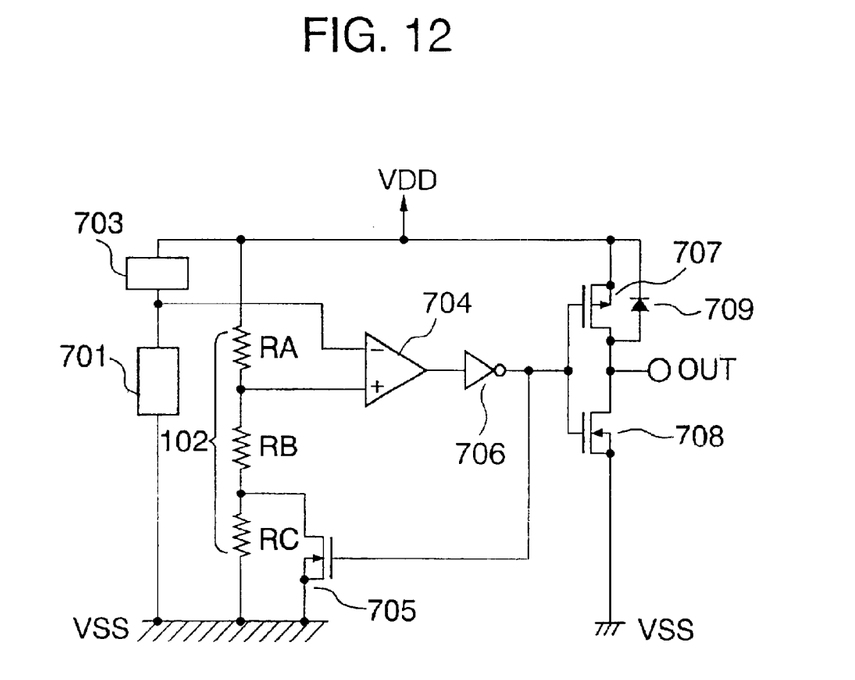
FIG. 12 is a block diagram of one embodiment of a voltage detector using a bleeder resistance circuit according to the present invention.

FIG. 12 is a block diagram of one embodiment of a voltage detector using a bleeder resistance circuit according to the present invention.

For simplification, a simple circuit is shown. However, in the case of an actual product, functions may be added if necessary.

Basic circuit structure components of the voltage detector are a current source 703, a standard voltage circuit 701, a bleeder resistance circuit 702, and an error amplifier 704. Further, an inverter 706, N-type transistors 705 and 708, a P-type transistor 707 and the like are added. Hereinafter, a part of the operation will be simply described.

When a voltage VDD is a predetermined reset voltage or higher, the N-type transistors 705 and 708 are turned OFF and the P-type transistor 707 is turned ON. Thus, the voltage VDD is output to an output terminal OUT.

At this time, the input voltage of the differential amplifier 704 becomes (RB+RC)/(RA+RB+RC)×VDD.

When the voltage VDD decreases and then becomes a detection voltage or lower, a voltage VSS is output to the output terminal OUT. At this time, the N-type transistor 705 is turned ON and the input voltage of the differential amplifier 704 becomes RB/(RA+RB)×VDD.

As described above, the basic operation is performed such that the standard voltage generated in the standard voltage circuit 701 is compared with the voltage divided by the bleeder resistance circuit 702 in the differential amplifier 704. Thus, the precision of the voltage divided by the bleeder resistance circuit 702 is very important. If the voltage dividing precision of the bleeder resistance circuit 702 is low, the input voltage to the differential amplifier 704 is varied, and thus, the predetermined reset voltage or the predetermined detection voltage can not be obtained. When the bleeder resistance circuit according to the present invention is used, the voltage dividing with high precision can be made. Thus, a yield of a product as an IC can be improved and the voltage detector with further high precision can be manufactured. Also, in order to suppress a consumption current of the IC, the resistance value of the entire bleeder resistance circuit 702 is made to be a high resistance of megaohm order or higher in many cases. At this time, in order to kept constant precision, since the bleeder resistance circuit is structured by combining very narrow shaped resistors, a wide area is required. In the voltage detector, it is not uncommon for the bleeder resistance circuit to occupy a half or more of the area of the entire IC chip. Since the variation in the resistance value of the respective resistors is small in the bleeder resistance circuit according to the present invention, the constant precision can be obtained by using the resistors with a short shape. Thus, the occupation area of the bleeder resistance circuit can be reduced, and this largely contributes to the reduction in the area of the entire IC chip.

Figure 13:
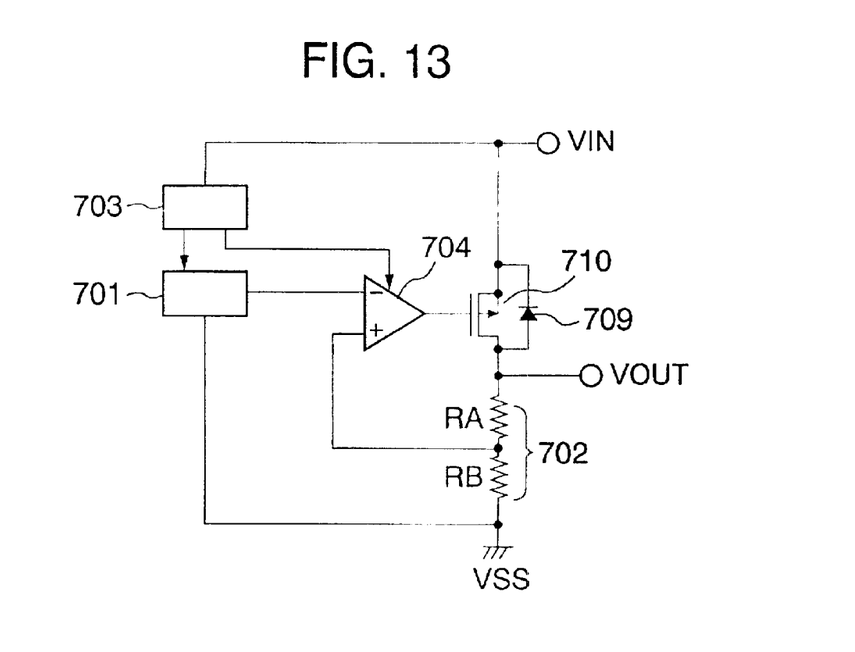
FIG. 13 is a block diagram of one embodiment of a voltage regulator using a bleeder resistance circuit according to the present invention.

FIG. 13 is a block diagram of one embodiment of a voltage regulator using a bleeder resistance circuit according to the present invention.

For simplification, a simple circuit is shown. However, in the case of an actual product, functions may be added if necessary.

Basic circuit structure elements of the voltage regulator are a current source 703, a standard voltage circuit 701, a bleeder resistance circuit 702, a differential amplifier 704, a P-type transistor 710 which acts as a current control transistor, and the like. Hereinafter, a part of the operation will be simply described.

The differential amplifier 704 compares the voltage divided by the bleeder resistance circuit 702 with the standard voltage generated in the standard voltage circuit 701, and then supplies, to the P-type transistor 710, a gate voltage required for obtaining a constant output voltage VOUT which is not influenced by a change in an input voltage VIN or a temperature. In the voltage regulator, as the case of the voltage detector described in FIG. 12, the basic operation is performed such that the standard voltage generated in the standard voltage circuit 701 is compared with the voltage divided by the bleeder resistance circuit 702 in the differential amplifier 704. Thus, the precision of the voltage divided by the bleeder resistance circuit 702 is very important. If the voltage dividing precision of the bleeder resistance circuit 702 is low, the input voltage to the differential amplifier 704 is varied, and thus, the predetermined output voltage VOUT can not be obtained. When the bleeder resistance circuit according to the present invention is used, the voltage dividing with high precision can be made. Thus, the yield of a product as an IC can be improved and the voltage regulator with higher precision can be manufactured.

Next, a method of manufacturing a semiconductor device according to the present invention will be described with reference to FIGS. 14A to 14F and FIGS. 15A to 15F.

FIGS. 14A to 14F are schematic cross sectional views representing one embodiment of a semiconductor device manufacturing method according to the present invention.

Figure 14A:
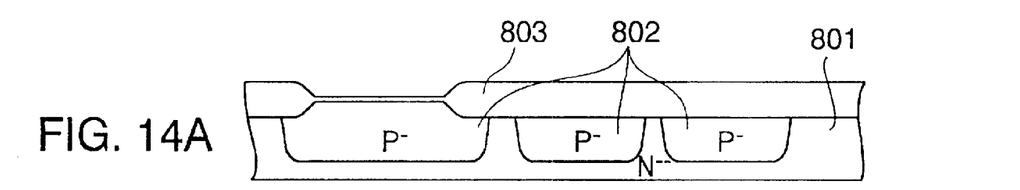
FIGS. 14A to 14F are schematic cross sectional views representing one embodiment of a semiconductor device manufacturing method according to the present invention.

In FIG. 14A, after a light N-type silicon substrate 801 is prepared and a P-type impurity is selectively introduced thereinto by an ion implantation method, a heat treatment is performed to form separated and independent P well regions 802. The surface concentration of the P well regions 802 is about 1E16 atoms/cm$^3$. Then, a field oxide film 803 having a thickness of about 8000 angstroms is selectively formed by the LOCOS method.

Figure 14B:
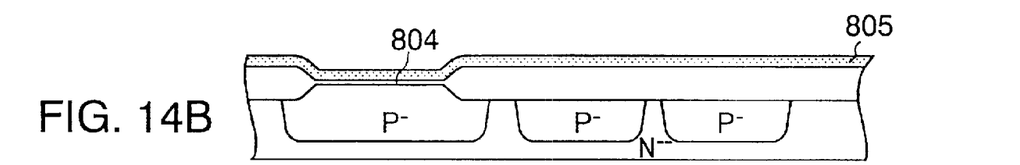

Next, as shown in FIG. 14B, after a gate oxide film 804 is formed, a channel dope for a predetermined threshold control is performed. Also, a polysilicon layer 805 is deposited with a thickness of about 4000 angstroms by a CVD method, and an impurity such as phosphorus is introduced thereinto by an ion implantation method so as to obtain a predetermined sheet resistance value.

Figure 14C:
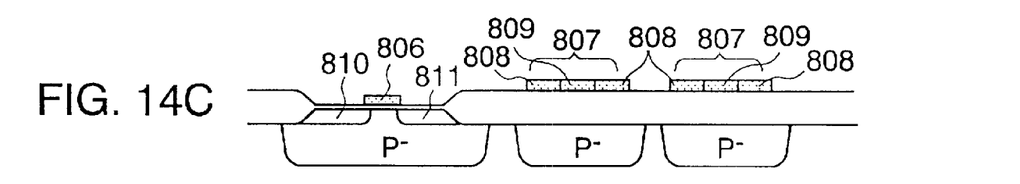

Next, as shown in FIG. 14C, an impurity such as BF$_2$ is selectively introduced by an ion implantation method such that a predetermined region has a predetermined sheet resistance value. An impurity such as phosphorus with a high concentration is selectively introduced such that a predetermined region of the polysilicon layer 805 has a low resistance. Then, the polysilicon layer 805 is processed by etching into a predetermined shape to form a gate electrode 806 with a low resistance and polysilicon resistors 807 having high resistance regions 809. The respective polysilicon resistors 807 are located to match with the P well regions 802 formed in the previous process. Then, a P-type impurity such as $BF_2$ is introduced by an ion implantation method to form a source region 810 and a drain region 811 of a P-type transistor and low resistance regions 808 of the polysilicon resistors 807. Here, although the N-type transistor is not shown, as in the case of the P-type transistor, an N-type impurity such as phosphorus is introduced by an ion implantation method to form the source region and the drain region of the transistor.

Figure 14D:
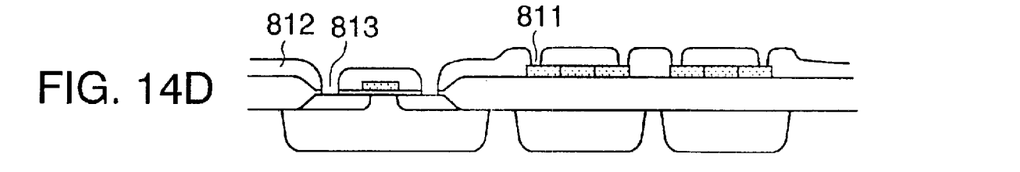

Next, as shown in FIG. 14D, an intermediate insulating film 812 made of PSG, NSG, or the like is deposited at about 8000 angstroms, and subsequently contact holes 813 are formed therein.

Figure 14E:
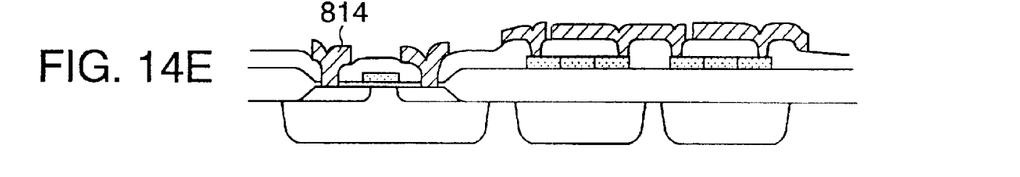

Next, as shown in FIG. 14E, an aluminum layer 814 having a thickness of about 1 μm as a wiring is deposited by a sputtering method, and then patterned into a predetermined shape. At this time, the aluminum layers 814 connected with the low resistance regions 808 in the ends of the respective polysilicon resistors 807 are arranged on the respective polysilicon resistors 807. Further, although not shown, the aluminum layers 814 are connected with the P well regions 802 located under the respective polysilicon resistors 807 through the field oxide film 803.

Figure 14F:
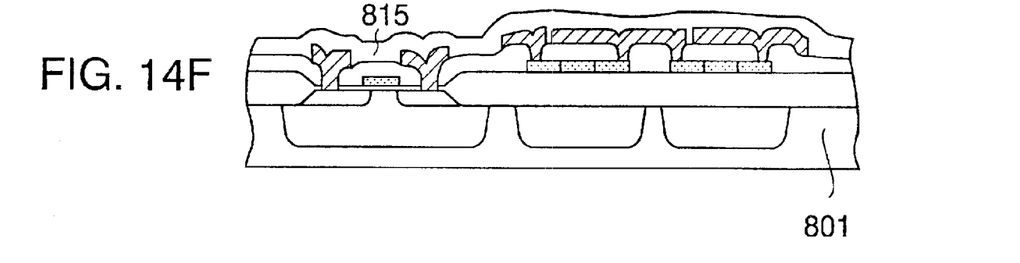

Next, as shown in FIG. 14F, a protective film 815 made of a silicon nitride film and having a thickness of about 8000 angstroms is formed. In addition, although not shown, a portion of the protective film 815 is removed to provide a region of a bonding pad and the like. By the above processes, the semiconductor device having the polysilicon resistors according to the present invention is completed.

FIGS. 15A to 15F are schematic cross sectional views representing other embodiment of a semiconductor device manufacturing method according to the present invention.

Figures 15A, 15B:
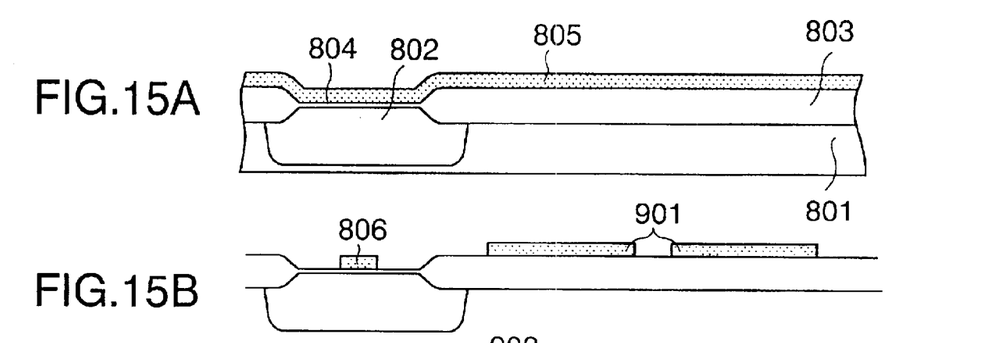
FIGS. 15A to 15F are schematic cross sectional views representing other embodiment of a semiconductor device manufacturing method according to the present invention.

In FIG. 15A, after a light N-type silicon substrate 801 is prepared and a P-type impurity is selectively introduced thereinto by an ion implantation method, a heat treatment is performed to form a separated and independent P well region 802. The surface concentration of the P well region 802 is about 1E16 atoms/cm³. Here, it is different from the embodiment described in FIGS. 14A to 14F that the P well region 802 are not necessarily formed in a region in which polysilicon resistors are to be formed by a later process. Next, a field oxide film 803 having a thickness of about 8000 angstroms is selectively formed by the LOCOS method. Next, after a gate oxide film 804 is formed, a channel dope for a predetermined threshold control is performed. Further, a polysilicon layer 805 is deposited with a thickness of about 4000 angstroms by a CVD method. Then, the impurity such as phosphorus with a high concentration is introduced such that the polysilicon layer 805 has a low resistance.

Next, as shown in FIG. 15B, the polysilicon layer 805 is processed by etching into a predetermined shape to form a gate electrode 806 with a low resistance and low resistance polysilicon layers 901.

Figure 15C:
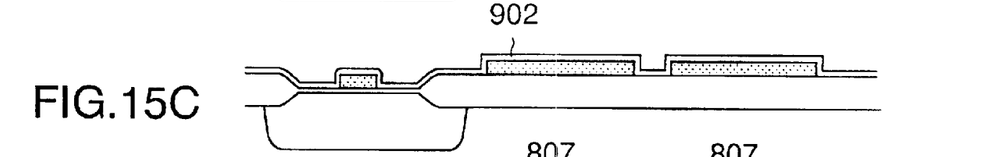

Next, as shown in FIG. 15C, a first insulating film 902 is formed by a thermal oxidation method, a CVD method, or the like. The first insulating film 902 is made of a multilayer film including a silicon oxide film or a silicon nitride film.

Figure 15D:
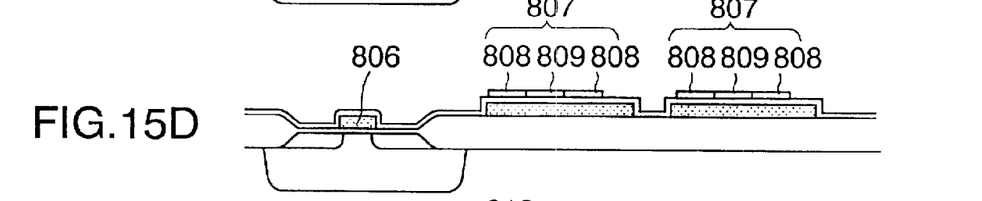

Next, as shown in FIG. 15D, polysilicon is deposited with a thickness of 1000 angstroms, and then the impurity such as $BF_2$ is introduced by an ion implantation method so as to obtain a predetermined sheet resistance. Subsequently, after patterning into a predetermined shape, the P-type impurity such as $BF_2$ is introduced by an ion implantation method to simultaneously form low resistance regions 808 and a source region 810 and a drain region 811 of a P-type transistor. Thus, polysilicon resistors 807 each having a high resistance region 809 sandwiched between the low resistance regions 808 can be formed. Here, the respective polysilicon resistors 807 are formed on the independent low resistance polysilicon layers 901 through the first insulating film 902. Also, although the N-type transistor region is not shown, as in the case of the P-type transistor, the N-type impurity such as phosphorus is introduced by an ion implantation method to form the source region and the drain region of the transistor.

Figure 15E:
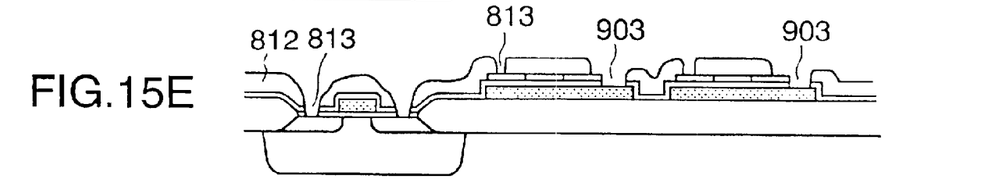

Next, as shown in FIG. 15E, an intermediate insulating film 812 made of PSG, NSG, or the like is deposited at about 8000 angstroms, and subsequently contact holes 813 are formed therein. At this time, common contact holes 903 are formed such that the low resistance regions 808 of the polysilicon resistors 807 and the low resistance polysilicon layers 901 can be connected with each other.

Figure 15F:
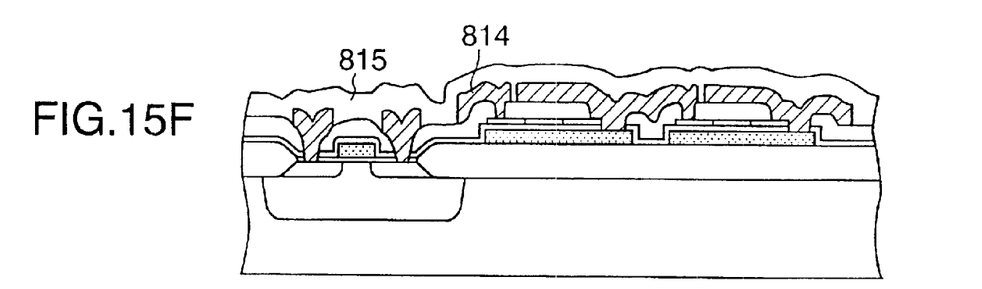

Next, as shown in FIG. 15F, a lamination film of Ti/TiN as barrier metals is deposited at about 1500 angstroms by a sputtering method. Thereafter, an aluminum layer 814 having a thickness of about 1 μm as a wiring is deposited and then patterned into a predetermined shape. At this time, the aluminum layers 814 for connecting the low resistance regions 808 located in the ends of the respective polysilicon resistors 807 with the low resistance polysilicon layers 901 located under the polysilicon resistors 807 through the first insulating film 902 through the common contact holes 903 are arranged on the respective polysilicon resistors 807. Next, a protective film 815 made of a silicon nitride film and having a thickness of about 8000 angstroms is formed. In addition, although not shown, a portion of the protective film 815 is removed to provide a region of a bonding pad and the like. By the above processes, the semiconductor device having the polysilicon resistors according to the present invention is completed.

As described above, according to the present invention, when the potential of the respective polysilicon resistors is made to be equal to the potentials of conductors located over and under the respective polysilicon resistors, the resistance values of the polysilicon resistors are accurately kept in the bleeder resistance circuit. Thus, the bleeder resistance circuit having an accurate voltage dividing ratio and high precision can be realized. At this time, when the film thickness of the polysilicon resistors is 2000 angstroms or thinner and the impurity introduced into the polysilicon resistors is made to be the P-type, the variation in the resistance values of the polysilicon resistors can be reduced and the bleeder resistance circuit having higher precision can be realized. Further, when the film thickness of the polysilicon resistors in the bleeder resistance circuit is thinned, the temperature coefficient of the resistance value can be reduced. In particular, when the film thickness is 1000 angstroms or thinner, the extremely small temperature coefficient of 3000 ppm/° C. or less can be obtained with the sheet resistance value of about 10 kiloohms/square. Therefore, there is an effect that the bleeder resistance circuit in which a wide temperature range and high voltage dividing precision can be obtained can be formed with an occupation area smaller than that in case of a conventional method.

In the voltage detector and the voltage regulator according to the present invention, the voltage dividing can be made with high precision. Thus, the yield of the product as the IC can be improved and the product with higher precision can be manufactured. Also, in order to suppress a consumption current of the IC, the resistance value of the entire bleeder resistance circuit is made to be a high resistance of megaohm order or higher in many cases. At this time, in order to keep constant precision, the bleeder resistance circuit is structured by combining very narrow shaped resistors, and thus, a wide area is required. In the voltage detector, it is not uncommon for the bleeder resistance circuit to occupy a half or more of the area of the entire IC chip. Since the variation in the resistance value of the respective resistors is small in the bleeder resistance circuit according to the present invention, the constant precision can be obtained by using the resistors with a short shape. Thus, the occupation area of the bleeder resistance circuit can be reduced, and this largely contributes to the reduction in the area of the entire IC chip.

In accordance with the semiconductor device manufacturing method according to present invention, there is an effect that the above semiconductor device can be formed without using a special process and largely increasing the number of processes.

What is claimed is:

1. A semiconductor device comprising: a plurality of thin film resistors connected in series to form a bleeder resistance circuit, each of the thin film resistors being made of a polysilicon film doped with B or $BF_2$ P-type impurities and having two end portions each having a high impurity concentration region; a first insulating film overlying the thin film resistors; a plurality of first conductors connected to the ends of the thin film resistors for connecting the thin film resistors in series; and a plurality of second conductors each connected to a respective one of the first conductor and overlying a respective one of the thin film resistors through the first insulating film.

2. A semiconductor device according to claim 1; further comprising a second insulating film overlying the thin film resistors; wherein the first conductors are connected to the thin film resistors and to the second conductors so that each of the thin film resistors is at the same potential as a respective one of the first conductors and a respective one of the second conductors.

3. A semiconductor device according to claim 1; wherein each of the first conductors is at the same potential as a respective one of the thin film resistors.

4. A semiconductor device according to claim 2; wherein each of the second conductors is at the same potential as a respective one of the thin film resistors.

5. A semiconductor device according to claim 1; wherein the film thickness of each of the thin film resistors is several tans to 2000 angstroms.

6. A semiconductor device according to claim 1; wherein the film thickness of each of the thin film resistors is several tens to 1000 angstroms.

7. A semiconductor device according to claim 1; wherein the first conductors are composed of well regions formed in a silicon substrate.

8. A semiconductor device to claim 1; wherein the first conductors are made of polysilicon.

9. A semiconductor device according to claim 1; wherein the second conductors are made of polysilicon.

10. A semiconductor device according to claim 1; wherein the second conductors are made of aluminum.

11. A semiconductor device according to claim 1; wherein the second conductors are made from a lamination film of a barrier metal and a suicide film.

12. A semiconductor device according to claim 1; wherein the first conductors are made of a material forming a gate electrode of a MOS transistor formed on the same chip as the thin film transistors.

13. A semiconductor device according to claim 1; wherein potentials of each of the plurality of thin film resistors and the first conductors connected to them are fixed by a metal wiring material through a common contact hole.

14. A semiconductor device according to claim 1; further comprising a MOS transistor having a gate electrode; and wherein a film thickness of each of the thin film resistors is forged thinner than a film thickness of the gate electrode of the MOS transistor.

15. A semiconductor device according to claim 14; wherein the film thickness of the thin film resistors is several tens to 1000 angstroms.

16. A semiconductor device according to claim 14; wherein a temperature dependency of the resistance value of the thin film resistors is −4000 ppm/° C. or lower.

17. A semiconductor device according to claim 1; wherein each of the thin film resistors has a low resistance region having the high impurity concentration for connecting with metal wiring, and a high resistance region; and wherein a film thickness of the high resistance region is smaller than that of the low resistance region.

18. A Semiconductor device according to claim 17; wherein the film thickness of the high resistance region is several tens to 1000 angstroms and the film thickness of the low resistance region is 2000 to 10000 angstroms.

19. A semiconductor device according to claim 17; wherein the low resistance region arid the high resistance region of the thin film resistors are formed on a common flat surface.

20. A semiconductor device according to claim 17; wherein upper surfaces of the low resistance region and the high resistance region of the thin film resistors form the same flat surface.

21. A semiconductor device according to claim 2; wherein the first insulating film and the second insulating film are made of a silicon oxide films.

22. A semiconductor device according to claim 2; wherein one or both of the first insulating film and the second insulating film are made of a multilayer film containing a silicon nitride film.

23. A semiconductor device according to claim 1; wherein a resistance value of the entire bleeder resistance circuit using the plurality of thin film resistors is 1 mega-ohm to 100 mega-ohms.

24. A semiconductor device comprising:
a plurality of first conductors;
a first insulating film overlying the first conductors;
a plurality of thin film resistors overlying the first insulating film and electrically connected in series by the first conductors, each of the thin film resistors being made of a polysilicon film doped with B or $BF_2$ P-type impurities and overlying a respective one of the first conductors; and
first connecting means for electrically connecting each of the first conductors to an end of a respective one of the thin film resistors so that each of the first conductors is at the same potential as the respective one of the thin film resistors.

25. A semiconductor device according to claim 24, wherein each of the thin film resistors has two ends, the thin film resistors being spaced from one another along a line and the two ends of each of the resistors being spaced apart along the line.

26. A semiconductor device according to claim 25; further comprising a second insulating film overlying the plurality of thin film resistors; a plurality of second conductors formed on the second insulating film and each overlying a respective one of the thin film resistors; and second connecting means conductively connecting one end of each the thin film resistors to a respective one of the second conductors so that each of the thin film resistors is at the same potential as the respective one or the second conductors.

* * * * *